(12) United States Patent
Wang et al.

(10) Patent No.: US 12,538,768 B2
(45) Date of Patent: Jan. 27, 2026

(54) SEMICONDUCTOR STRUCTURE AND FABRICATION METHOD THEREOF

(71) Applicant: UNITED MICROELECTRONICS CORP., Hsin-Chu (TW)

(72) Inventors: Chia-Ling Wang, Tainan (TW); Ping-Hung Chiang, Tainan (TW); Ta-Wei Chiu, Changhua County (TW); Chia-Wen Lu, Tainan (TW); Wei-Lun Huang, Tainan (TW); Yueh-Chang Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 436 days.

(21) Appl. No.: 18/109,225

(22) Filed: Feb. 13, 2023

(65) Prior Publication Data

US 2024/0243004 A1 Jul. 18, 2024

(30) Foreign Application Priority Data

Jan. 18, 2023 (TW) .................................. 112102171

(51) Int. Cl.
*H01L 21/762* (2006.01)
*H01L 23/13* (2006.01)

(52) U.S. Cl.
CPC ........ *H01L 21/76224* (2013.01); *H01L 23/13* (2013.01)

(58) Field of Classification Search
CPC ............... H01L 21/76224; H01L 23/13; H01L 21/76232; H01L 21/76229
See application file for complete search history.

(56) References Cited

U.S. PATENT DOCUMENTS

| | | | |
|---|---|---|---|
| 6,455,405 B1 | 9/2002 | Ku | |
| 6,468,099 B2 | 10/2002 | Kim | |
| 8,546,268 B2 | 10/2013 | Entalai | |
| 11,404,305 B1 | 8/2022 | Chiu | |
| 2003/0235964 A1 | 12/2003 | Wolstenholme | |
| 2012/0034783 A1* | 2/2012 | Entalai ............. | H01L 21/76232 438/694 |
| 2018/0102408 A1 | 4/2018 | Hsiung | |
| 2018/0151414 A1* | 5/2018 | Wu ....................... | H10D 84/038 |
| 2018/0233556 A1* | 8/2018 | Hsiung ............... | H10D 62/115 |
| 2023/0062058 A1* | 3/2023 | Zhang ................ | H10D 84/0151 |

FOREIGN PATENT DOCUMENTS

JP 2020-536394 A 12/2020

* cited by examiner

*Primary Examiner* — Julia Slutsker
(74) *Attorney, Agent, or Firm* — Winston Hsu

(57) ABSTRACT

A semiconductor structure includes a substrate having a first device region and a second device region in proximity to the first device region. A first trench isolation structure is disposed in the substrate between the first device region and the second device region. The first trench isolation structure includes a first bottom surface within the first device region and a second bottom surface within the second device region. The first bottom surface is lower than the second bottom surface. The first trench isolation structure includes a first top surface within the first device region and a second top surface within the second device region. The first top surface is coplanar with the second top surface.

9 Claims, 12 Drawing Sheets

SEMICONDUCTOR STRUCTURE AND FABRICATION METHOD THEREOF

BACKGROUND OF THE INVENTION

1. Field of the Invention

The invention relates to the technical field of semiconductors, in particular to an improved semiconductor structure and a manufacturing method thereof.

2. Description of the Prior Art

The development of semiconductor integrated circuit technology progresses continuously and circuit designs in products of the new generation become smaller and more complicated than those of the former generation. In some products, semiconductor devices having different threshold voltages and/or operation voltages are required in the integrated circuits, and the structures of the semiconductor devices may be different from one another for realizing different threshold voltages and/or operation voltages. For example, a relatively thicker gate oxide layer may be used to enhance the operation voltage of a semiconductor device in the relatively higher voltage area, and height differences between parts in the relatively higher voltage area and parts in the relatively lower voltage area may be generated accordingly. The height differences may cause problems in the related manufacturing processes and have negative influence on the manufacturing yield.

SUMMARY OF THE INVENTION

One object of the present invention is to provide an improved semiconductor structure and a fabrication method thereof to solve the deficiencies or shortcomings of the prior art.

One aspect of the invention provides a semiconductor structure including a substrate comprising a first device region and a second device region in proximity to the first device region; and a first trench isolation structure in the substrate between the first device region and the second device region. The first trench isolation structure includes a first bottom surface within the first device region and a second bottom surface within the second device region. The first bottom surface is lower than the second bottom surface. The first trench isolation structure includes a first top surface within the first device region and a second top surface within the second device region. The first top surface is coplanar with the second top surface.

According to some embodiments, the first device region is a medium-voltage device region and the second device region is an input/output (I/O) device region.

According to some embodiments, a top surface of the substrate within the first device region is lower than a top surface of the substrate within the second device region.

According to some embodiments, the semiconductor structure further includes a first gate oxide layer on the top surface of the substrate within the first device region; and a second gate oxide layer on the top surface of the substrate within the second device region, wherein the first gate oxide layer is thicker than the second gate oxide layer.

According to some embodiments, the first gate oxide layer has a thickness of about 200-220 angstroms and the second gate oxide layer has a thickness of about 30-60 angstroms.

According to some embodiments, a top surface of the second gate oxide layer is coplanar with the second top surface of the first trench isolation structure within the second device region.

According to some embodiments, the semiconductor structure further includes a third device region in proximity to the second device region; and a second trench isolation structure in the substrate between the third device region and the second device region, wherein the second trench isolation structure comprises a third bottom surface within the second device region and a fourth bottom surface within the third device region, wherein the third bottom surface is coplanar with the fourth bottom surface.

According to some embodiments, the third device region is a 1.2V device region.

According to some embodiments, the semiconductor structure further includes a fourth device region in proximity to the third device region; and a third trench isolation structure in the substrate between the third device region and the fourth device region, wherein the third trench isolation structure comprises a fifth bottom surface within the third device region and a sixth bottom surface within the fourth device region, wherein the fifth bottom surface is coplanar with the sixth bottom surface.

According to some embodiments, the fourth device region is a low-voltage or SRAM device region.

Another aspect of the invention provides a method for forming a semiconductor structure. A substrate comprising a first device region and a second device region in proximity to the first device region is provided. A first trench isolation structure is formed in the substrate between the first device region and the second device region. The first trench isolation structure includes a first bottom surface within the first device region and a second bottom surface within the second device region. The first bottom surface is lower than the second bottom surface. The first trench isolation structure includes a first top surface within the first device region and a second top surface within the second device region. The first top surface is coplanar with the second top surface.

According to some embodiments, the first device region is a medium-voltage device region and the second device region is an input/output (I/O) device region.

According to some embodiments, a top surface of the substrate within the first device region is lower than a top surface of the substrate within the second device region.

According to some embodiments, the method further includes the steps of forming a first gate oxide layer on the top surface of the substrate within the first device region; and forming a second gate oxide layer on the top surface of the substrate within the second device region, wherein the first gate oxide layer is thicker than the second gate oxide layer.

According to some embodiments, the first gate oxide layer has a thickness of about 200-220 angstroms and the second gate oxide layer has a thickness of about 30-60 angstroms.

According to some embodiments, a top surface of the second gate oxide layer is coplanar with the second top surface of the first trench isolation structure within the second device region.

According to some embodiments, the method further includes the steps of forming a third device region in proximity to the second device region; and forming a second trench isolation structure in the substrate between the third device region and the second device region, wherein the second trench isolation structure comprises a third bottom surface within the second device region and a fourth bottom surface within the third device region, wherein the third bottom surface is coplanar with the fourth bottom surface.

According to some embodiments, the third device region is a 1.2V device region.

According to some embodiments, the method further includes the steps of forming a fourth device region in proximity to the third device region; and forming a third trench isolation structure in the substrate between the third device region and the fourth device region, wherein the third trench isolation structure comprises a fifth bottom surface within the third device region and a sixth bottom surface within the fourth device region, wherein the fifth bottom surface is coplanar with the sixth bottom surface.

According to some embodiments, the fourth device region is a low-voltage or SRAM device region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
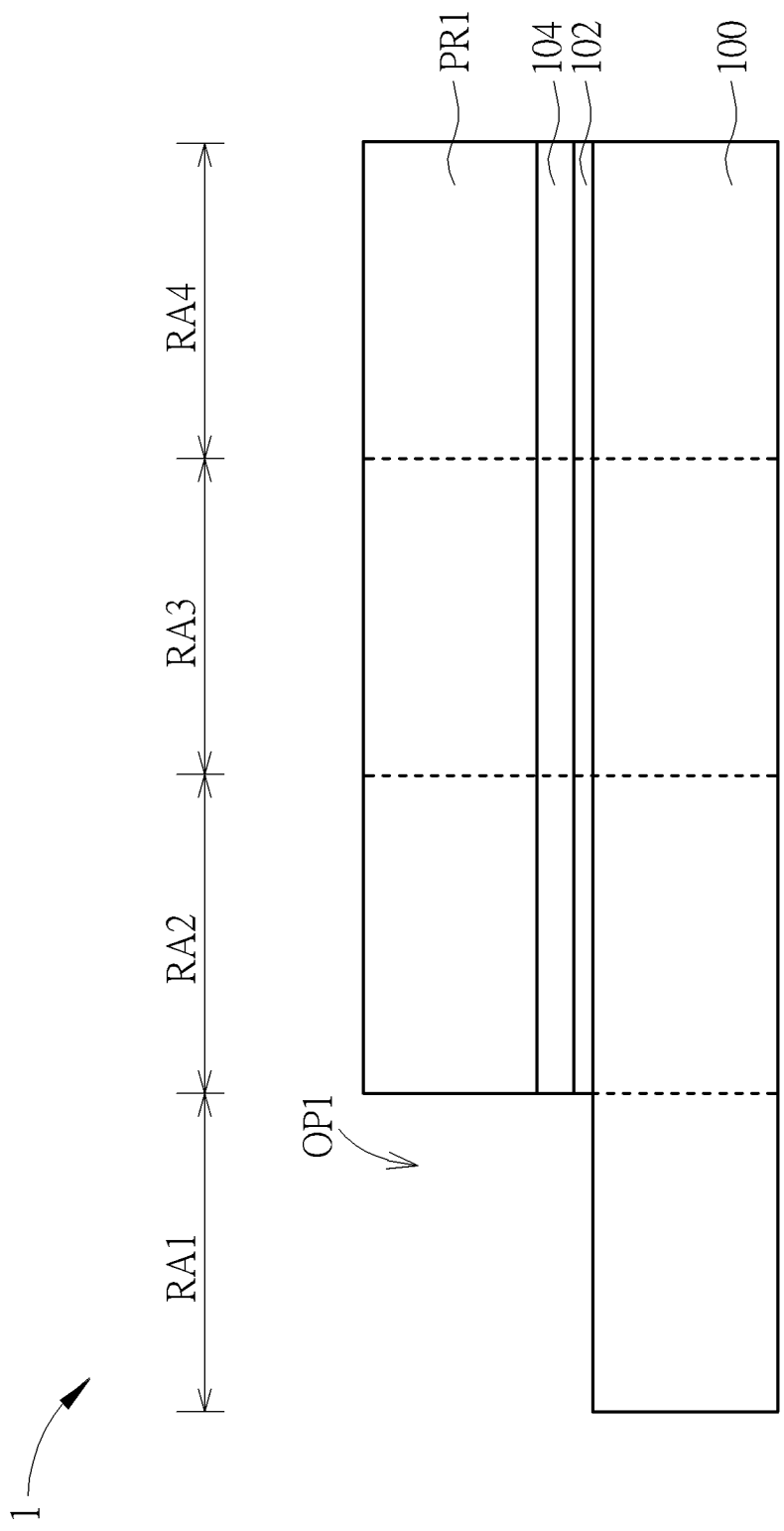
FIG. 1 to FIG. 11 are schematic diagrams illustrating a method for fabricating a semiconductor structure according to an embodiment of the present invention.

Please refer to FIG. 1 to FIG. 11, which are schematic diagrams showing a manufacturing method of a semiconductor structure 1 according to an embodiment of the present invention. For example, the semiconductor structure 1 may be suitable for a 22 nm embedded high-voltage device or process platform. As shown in FIG. 1, a substrate 100 is provided. For example, the substrate 100 may be a semiconductor substrate such as a silicon substrate. A silicon oxide pad layer 102 and a silicon nitride pad layer 104 are formed on the substrate 100. According to an embodiment of the present invention, the substrate 100 includes a first device region RA1, a second device region RA2 in proximity to the first device region RA1, a third device region RA3 in proximity to the second device region RA2, and a fourth device region RA4 in proximity to the third device region RA3.

According to an embodiment of the present invention, for example, the first device region RA1 may be a medium voltage (MV) device region, and the second device region RA2 may be an input/output (I/O) device region. According to an embodiment of the present invention, for example, the third device region RA3 may be a 1.2V device region. According to an embodiment of the present invention, for example, the fourth device region RA4 may be a low-voltage (LV) device region or a static random access memory (SRAM) device region.

Subsequently, a photoresist pattern PR1 is formed on the silicon nitride pad layer 104, which has an opening OP1, exposing the silicon nitride pad layer 104 of the first device region RA1. Using an etching process, the silicon nitride pad layer 104 and the silicon oxide pad layer 102 in the first device region RA1 are removed through the opening OP1 to expose the substrate 100.

Figure 2:
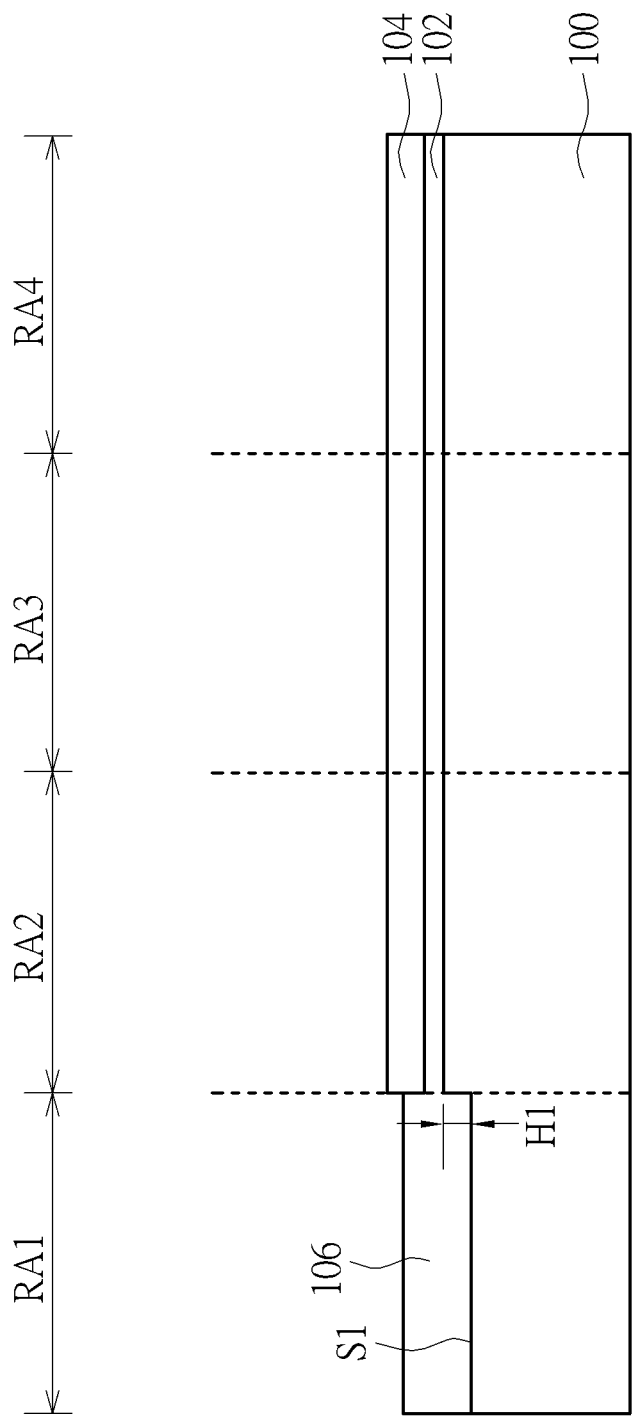

As shown in FIG. 2, the photoresist pattern PR1 is then removed. A thermal oxidation process is then performed to form a silicon oxide layer 106 on the substrate 100 in the first device region RA1. According to an embodiment of the present invention, for example, the thickness of the silicon oxide layer 106 is about 420 angstroms. At this point, the top surface S1 of the substrate 100 in the first device region RA1 is lower than the top surfaces of the surrounding substrates 100, forming a step height H1 of about 210 angstroms.

Figure 3:
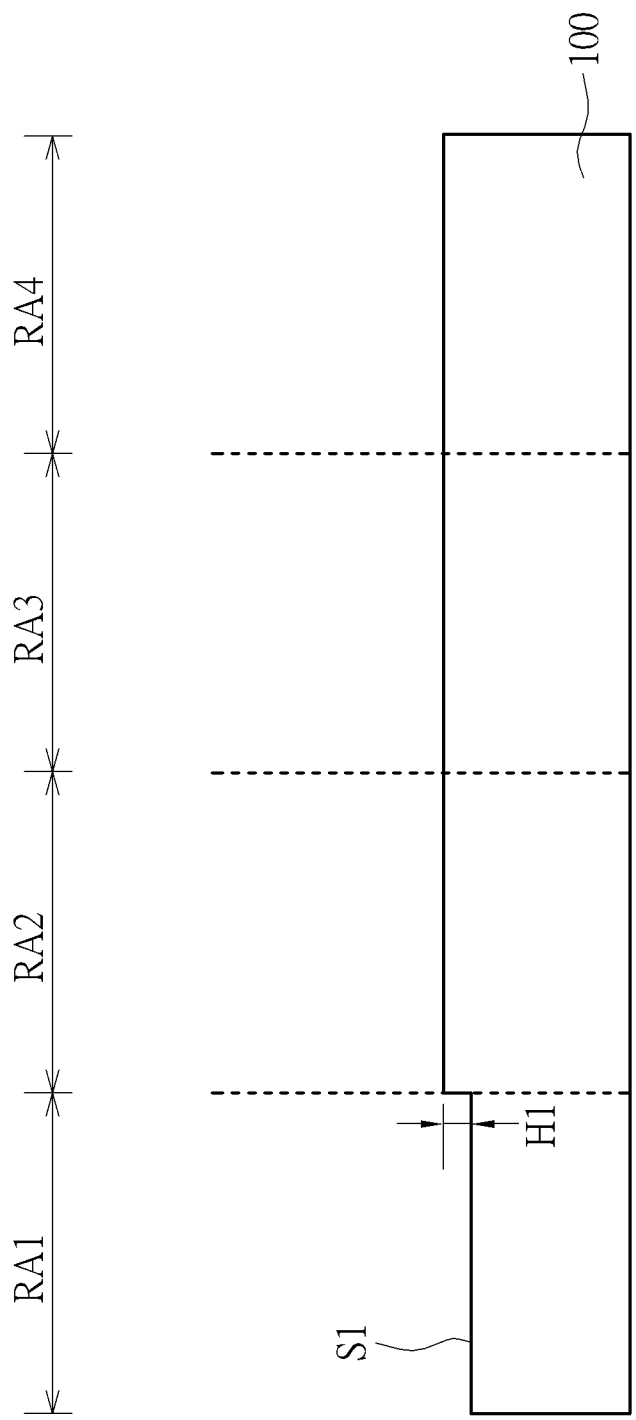

As shown in FIG. 3, an etching process, such as a wet etching process, is performed to remove the silicon oxide pad layer 102 and the silicon nitride pad layer 104 on the substrate 100.

Figure 4:
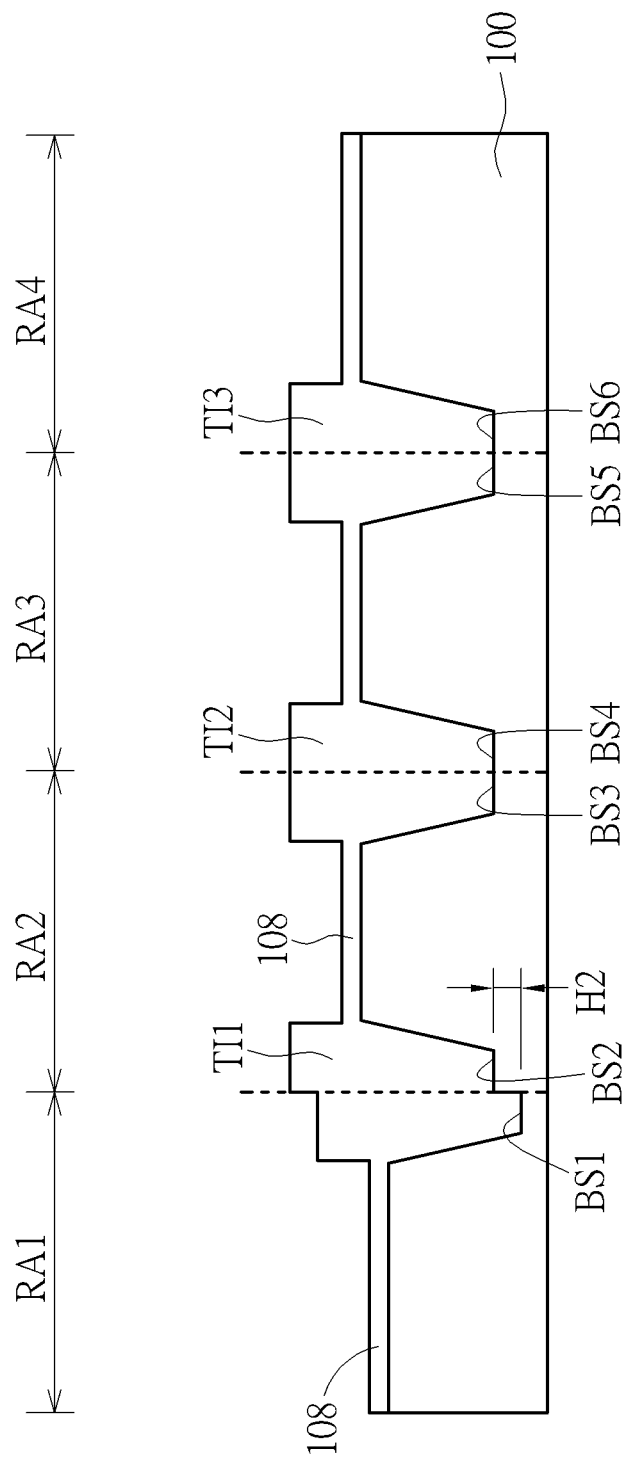

As shown in FIG. 4, next, after forming the silicon oxide pad layer 108 and the silicon nitride pad layer (not shown) on the substrate 100, the shallow trench insulation process is performed. A first trench isolation structure TI1 is formed in the substrate 100 between the first device region RA1 and the second device region RA2, a second trench isolation structure TI2 is formed in the substrate 100 between the second device region RA2 and the third device region RA3, and a third trench isolation structure TI3 is formed in the substrate 100 between the third device region RA3 and the fourth device region RA4. The silicon nitride pad layer is then removed.

According to an embodiment of the present invention, the first trench isolation structure TI1 includes a first bottom surface BS1 in the first device region RA1 and a second bottom surface BS2 in the second device region RA2. The first bottom surface BS1 is lower than the second bottom surface BS2, thereby forming a step height H2 of about 210 angstroms between the first device region RA1 and the second device region RA2.

According to an embodiment of the present invention, the second trench isolation structure TI2 includes a third bottom surface BS3 in the second device region RA2 and a fourth bottom surface BS4 in the third device region RA3. The third bottom surface BS3 and the fourth bottom surface BS4 are coplanar. According to an embodiment of the present invention, the third trench isolation structure TI3 includes a fifth bottom surface BS5 in the third device region RA3 and a sixth bottom surface BS6 in the fourth device region RA4. The fifth bottom surface BS5 and the sixth bottom surface BS6 are coplanar.

Figure 5:
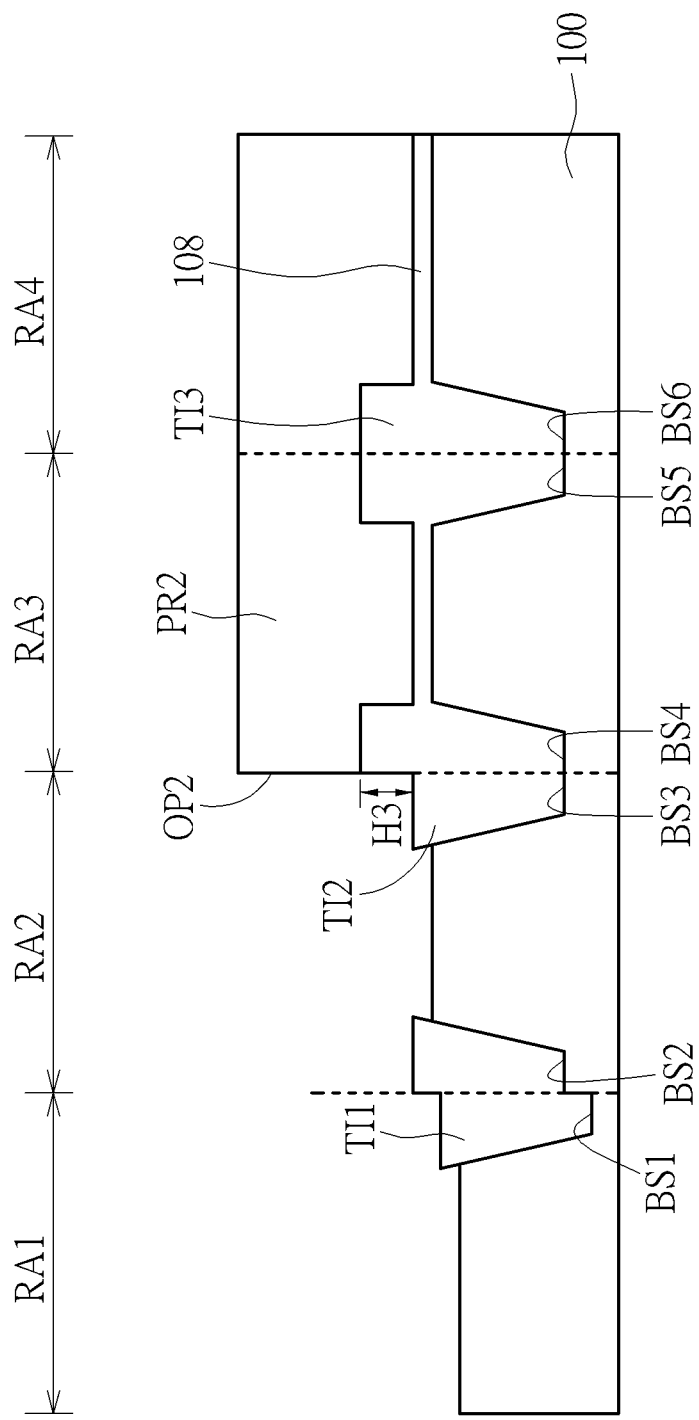

As shown in FIG. 5, a photoresist pattern PR2 is then formed on the substrate 100, which has an opening OP2, exposing the silicon oxide pad layer 108 in the first device region RA1 and the second device region RA2, the first trench isolation structure TI1, and the second trench isolation structure TI2 in the second device region RA2. Using an etching process, the silicon oxide pad layer 108 in the first device region RA1 and the second device region RA2 is removed through the opening OP2 to expose the substrate 100. At this point, the second trench isolation structure TI2 forms a step height H3 between the second device region RA2 and the third device region RA3. Subsequently, the photoresist pattern PR2 is removed.

Figure 6:
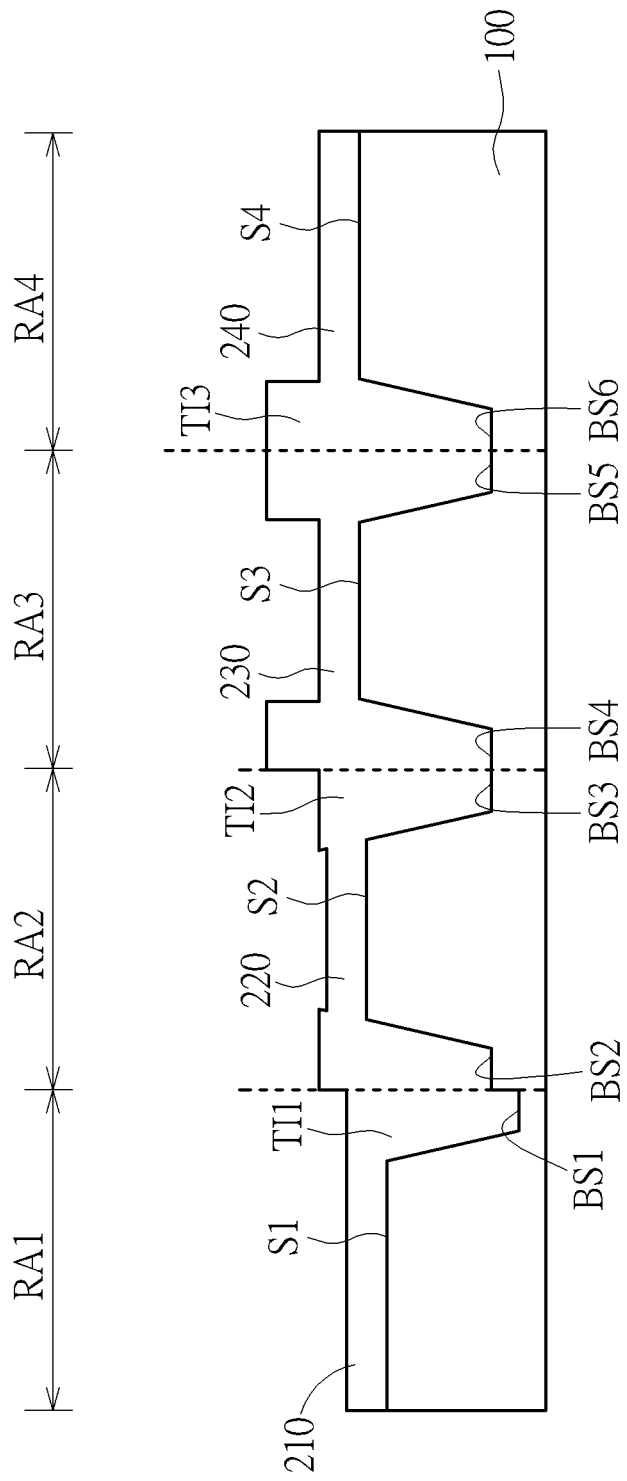

As shown in FIG. 6, a medium-voltage gate oxide layer process, for example, an in-situ steam generation (ISSG) process is then performed, and a deposition process, such as an atomic layer deposition (ALD) process, is performed to form silicon oxide layers 210-240 in the first device region RA1 to the fourth region RA4, respectively. According to an embodiment of the present invention, for example, the thickness of the silicon oxide layer 210 in the first device region RA1 and the silicon oxide layer 220 in the second device region RA2 may be about 210 angstroms, including an ISSG silicon oxide layer with a thickness of about 140 angstroms and an ALD silicon oxide layer with a thickness of about 70 angstroms. The silicon oxide layer 210 in the first device region RA1 serves as a medium voltage gate oxide layer.

According to an embodiment of the present invention, for example, the thickness of the silicon oxide layer 230 in the third device region RA3 and the silicon oxide layer 240 in the fourth device region RA4 may be about 259 angstroms, including the silicon oxide pad layer 108 with a thickness of about 49 angstroms, an ISSG silicon oxide layer with a thickness of about 140 angstroms and an ALD silicon oxide layer with a thickness of about 70 angstroms.

At this point, the top surface S1 of the substrate 100 in the first device region RA1 is slightly lower than the top surface S2 of the substrate 100 in the second device region RA2. The top surface S2 of the substrate 100 in the second device region RA2 is slightly lower than the top surface S3 of the substrate 100 in the third device region RA3. For example, the top surface S2 is lower than the top surface S3 by about 30 angstroms. The top surface S3 of the substrate 100 in the third device region RA3 is coplanar with the top surface S4 of the substrate 100 in the fourth device region RA4.

Figure 7:
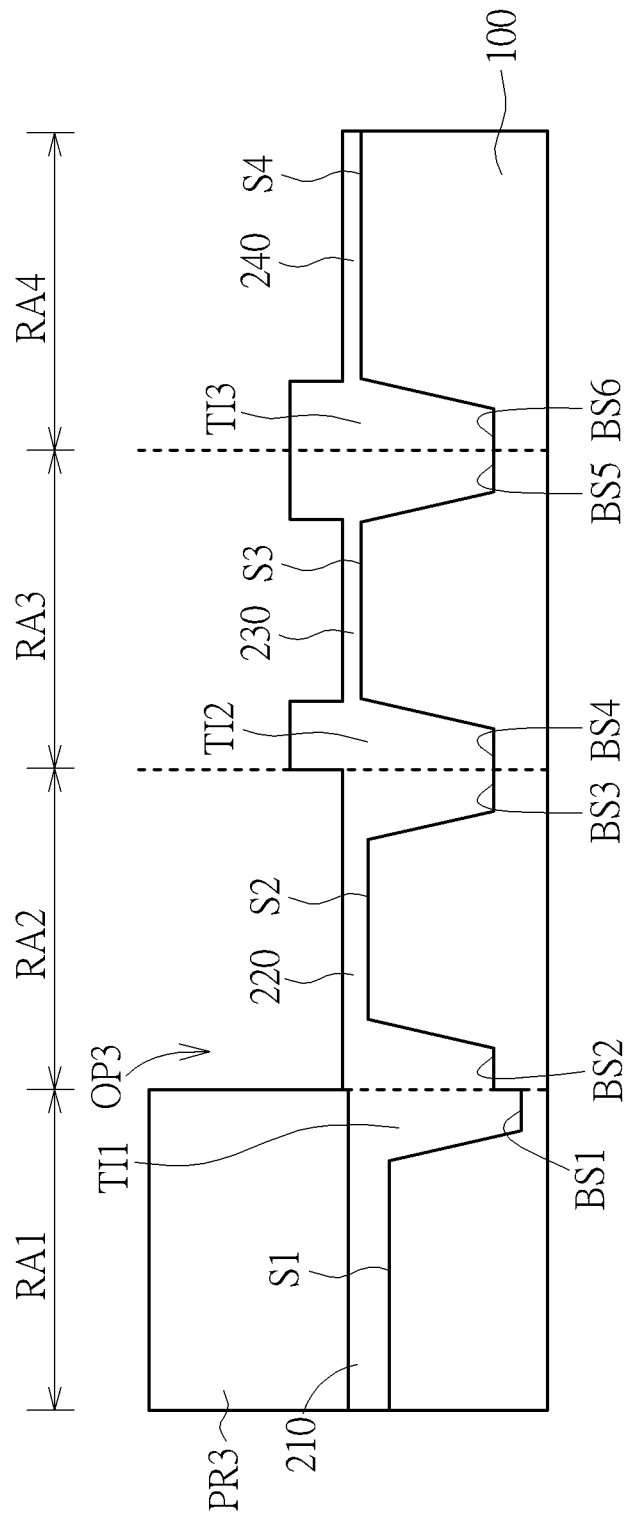

As shown in FIG. 7, next, a photoresist pattern PR3 is formed on the substrate 100, which has an opening OP3 exposing the second device region RA2, the third device region RA3, and the fourth device region RA4. Using an etching process, such as reactive ion etching (ME) or chemical oxide removal etching, a partial thickness of the silicon oxide layer 220-240 is etched and removed through the opening OP3. Subsequently, the photoresist pattern PR3 is removed. At this point, the thickness of the silicon oxide layer 220 in the second device region RA2 is about 90 angstroms, and the thickness of the silicon oxide layer 230 in the third device region RA3 and the thickness of the silicon oxide layer 240 in the fourth device region RA4 are about 140 angstroms.

Figure 8:
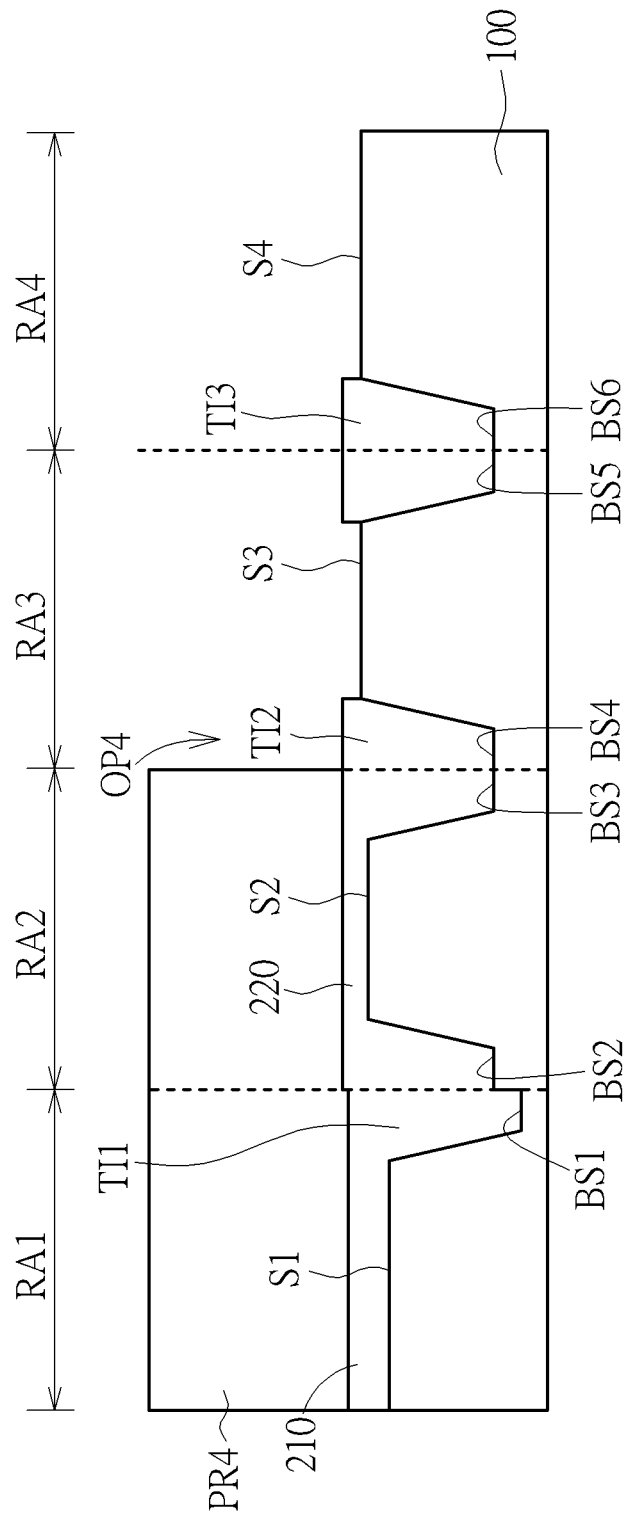

As shown in FIG. 8, a photoresist pattern PR4 is then formed on the substrate 100, which has an opening OP4 exposing the third device region RA3 and the fourth device region RA4. The silicon oxide layers 230-240 are completely removed through the opening OP4 by using an etching process, such as buffer oxide etch (BOE) or similar wet etching processes. Subsequently, the photoresist pattern PR4 is removed.

Figure 9:
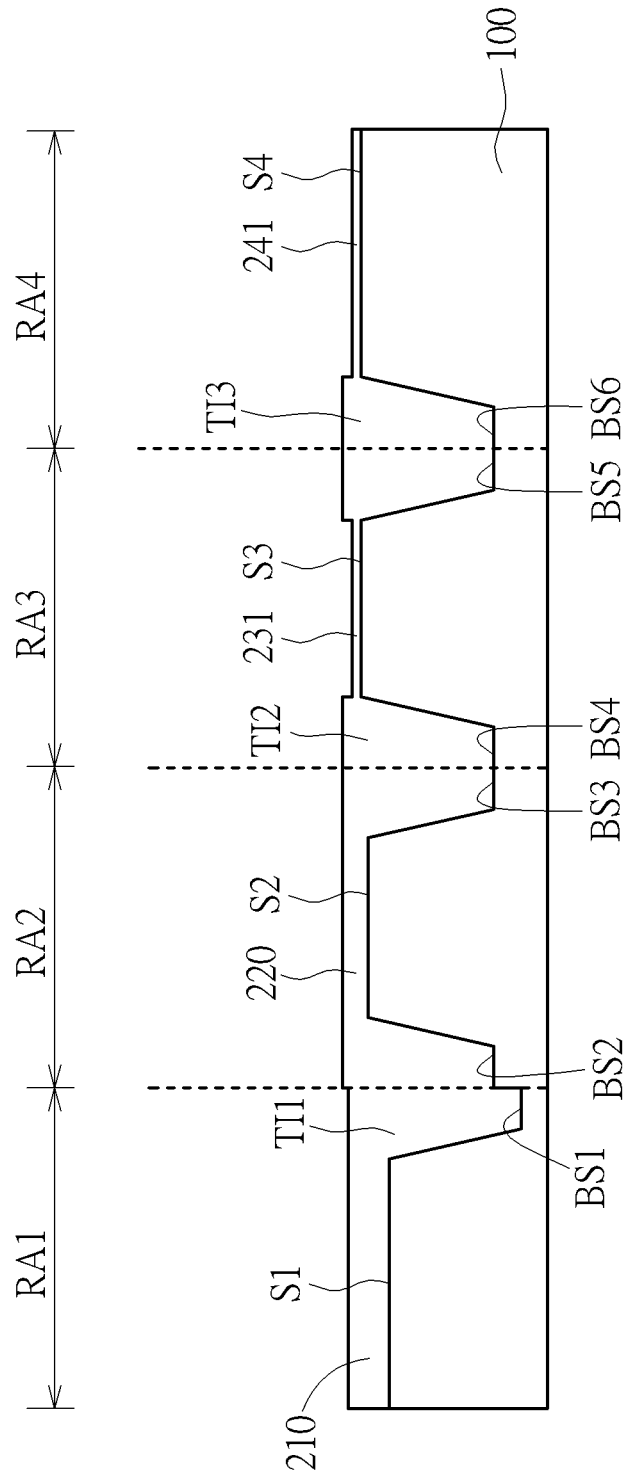

As shown in FIG. 9, an oxidation process is then performed to form a silicon oxide layer 231 and a silicon oxide layer 241 with a thickness of about 15.5 angstroms on the substrate 100 in the third device region RA3 and the fourth device region RA4, respectively.

Figure 10:
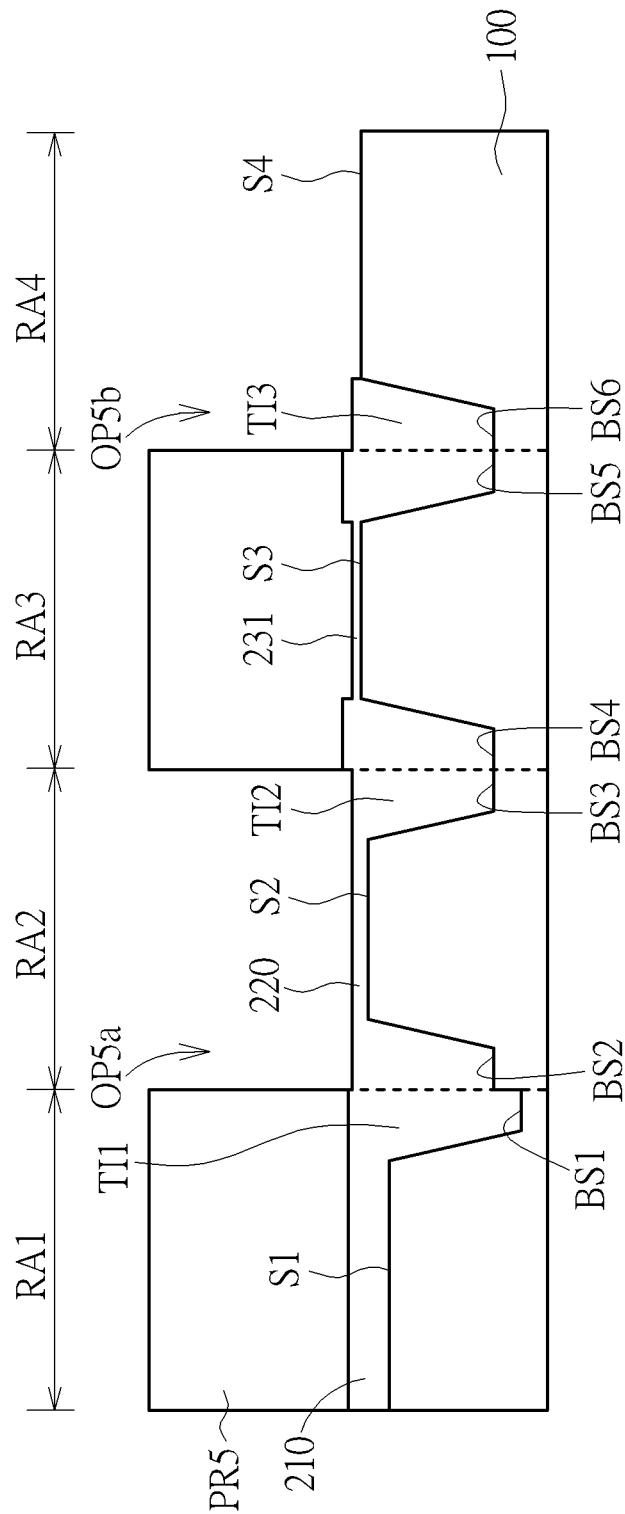

As shown in FIG. 10, a photoresist pattern PR5 is then formed on the substrate 100, which has openings OP5*a* and OP5*b*, respectively exposing the second device region RA2 and the fourth device region RA4. The silicon oxide layer 241 in the fourth device region RA4 and the partial thickness of the silicon oxide layer 220 in the second device region RA2 are etched away by using a wet etching process, such as dilute hydrofluoric acid (DHF). At this point, the remaining thickness of the silicon oxide layer 220 in the second device region RA2 is about 50 angstroms. Subsequently, the photoresist pattern PR5 is removed. The silicon oxide layer 220 in the second device region RA2 serves as a gate oxide layer of the input/output (I/O) devices.

Figure 11:
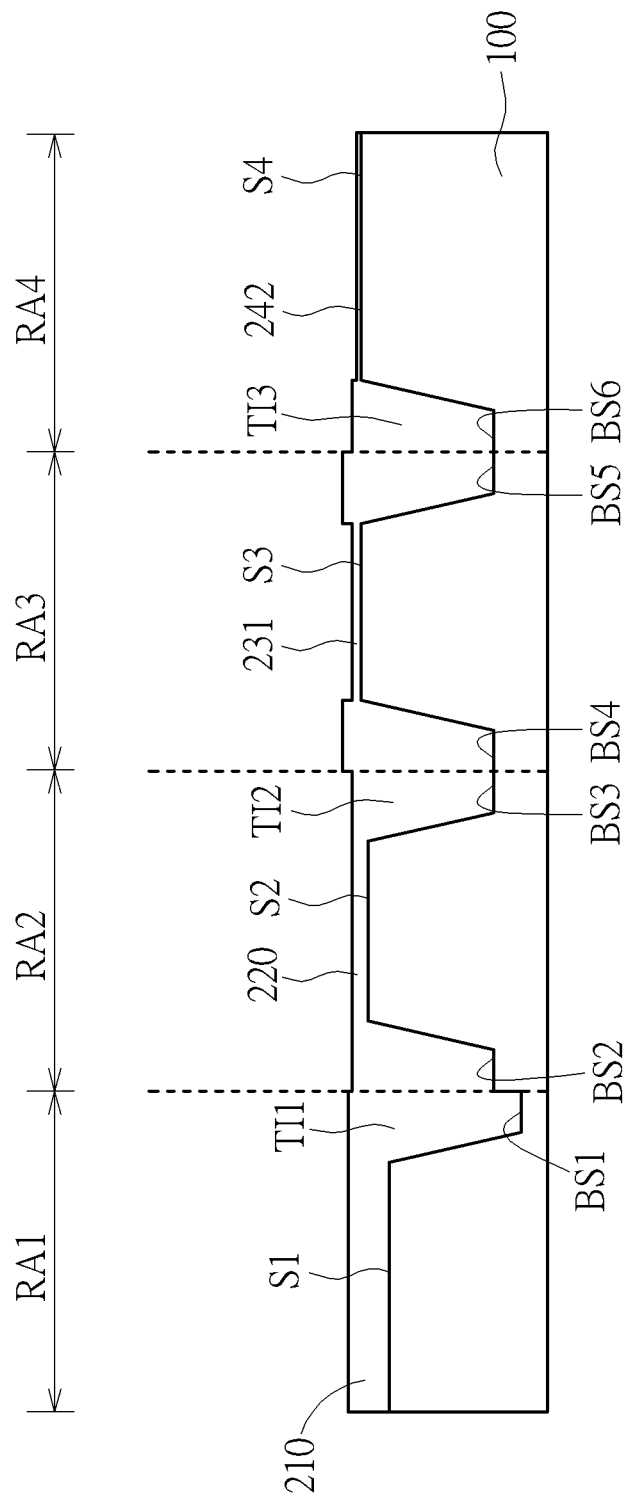

As shown in FIG. 11, an oxidation process is performed to form a silicon oxide layer 242 on the substrate 100 in the fourth device region RA4. According to an embodiment of the present invention, for example, the silicon oxide layer 242 has a thickness of about 8 angstroms. The silicon oxide layer 242 in the fourth device region RA4 serves as a gate oxide layer of low voltage devices or SRAM devices.

Figure 12:
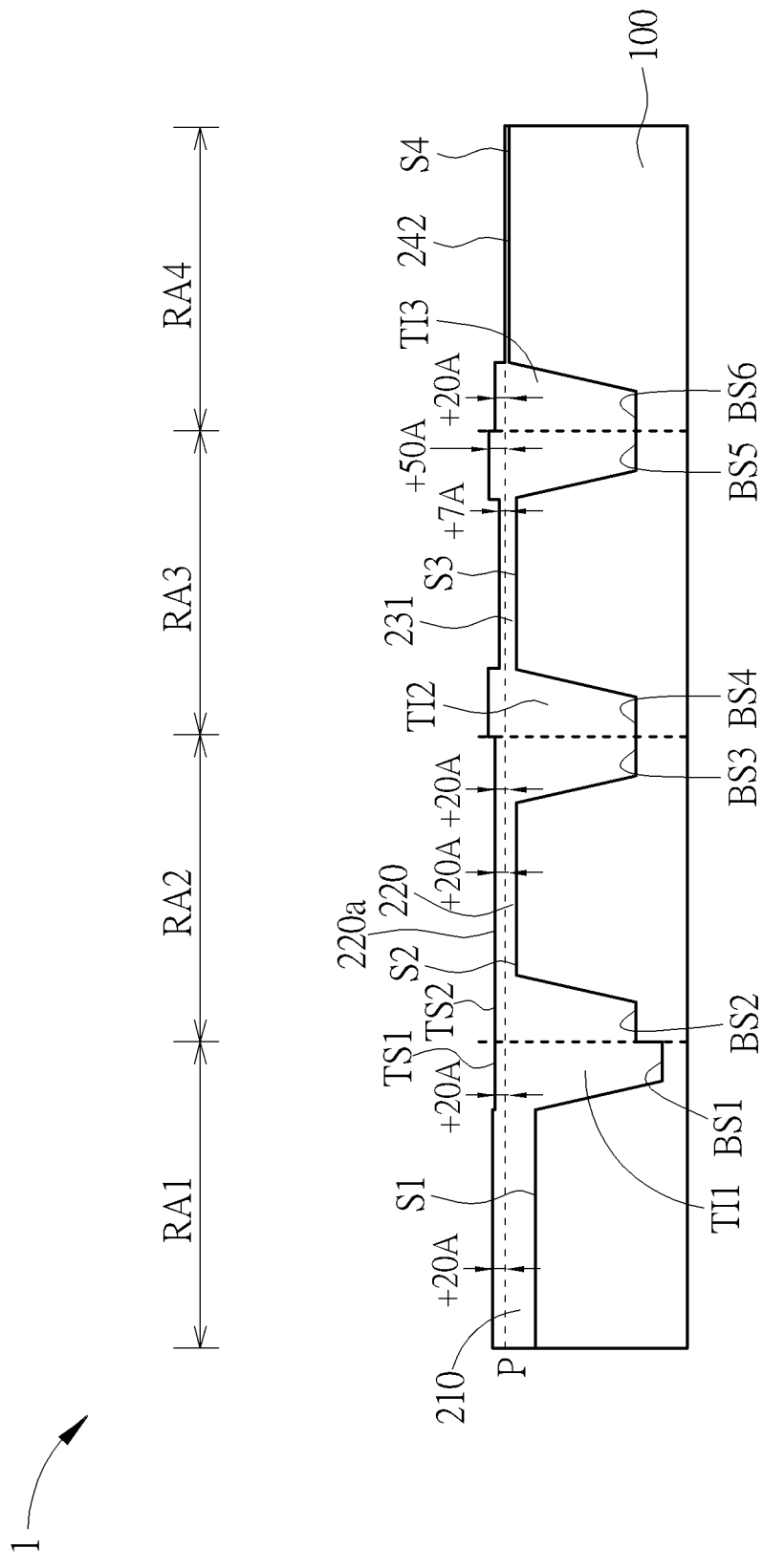
FIG. 12 is a schematic cross-sectional view of a semiconductor structure according to an embodiment of the present invention, in which the upper surface of the silicon oxide layer in the fourth device region is marked with a dotted line as a horizontal reference plane, so as to facilitate the display of the height difference between the regions.

Please refer to FIG. 12, in which the upper surface of the silicon oxide layer 242 in the fourth device region RA4 is marked with a dotted line P as a horizontal reference plane, so as to conveniently show the height difference between the regions. The first trench isolation structure TI1 further includes a first top surface TS1 in the first device region RA1 and a second top surface TS2 in the second device region RA2. The first top surface TS1 and the second top surface TS2 are coplanar and are about 20 angstroms above the horizontal reference plane indicated by the dotted line P.

According to an embodiment of the present invention, the top surface S1 of the substrate 100 in the first device region RA1 is lower than the top surface S2 of the substrate 100 in the second device region RA2. According to an embodiment of the present invention, for example, the top surface S1 of the substrate 100 in the first device region RA1 is lower than the horizontal reference plane indicated by the dotted line P by about 200 angstroms. According to an embodiment of the present invention, for example, the top surface S2 of the substrate 100 in the second device region RA2 is lower than the horizontal reference plane indicated by the dotted line P by about 30 angstroms. According to an embodiment of the invention, the silicon oxide layer 210 is thicker than the silicon oxide layer 220. According to an embodiment of the present invention, the silicon oxide layer 210 has a thickness of 200-220 angstroms, and the silicon oxide layer 220 has a thickness of 30-60 angstroms. According to an embodiment of the present invention, the top surface 220*a* of the silicon oxide layer 220 is coplanar with the second top surface TS2 of the first trench isolation structure TI1 in the second device region RA2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
 a substrate comprising a first device region and a second device region in proximity to the first device region;
 a first trench isolation structure in the substrate between the first device region and the second device region, wherein the first trench isolation structure comprises a first bottom surface within the first device region and a second bottom surface within the second device region, wherein the first bottom surface is lower than the second bottom surface, wherein the first trench isolation structure comprises a first top surface within the first device region and a second top surface within the second device region, wherein the first top surface is coplanar with the second top surface;
a third device region in proximity to the second device region;
a second trench isolation structure in the substrate between the third device region and the second device region;
a fourth device region in proximity to the third device region;
a third trench isolation structure in the substrate between the third device region and the fourth device region;
a first gate oxide layer on the top surface of the substrate within the first device region; and
a second gate oxide layer on the top surface of the substrate within the second device region, wherein the first gate oxide layer is thicker than the second gate oxide layer;
a third gate oxide layer on the top surface of the substrate within the third device region; and
a fourth gate oxide layer on the top surface of the substrate within the fourth device region, wherein an upper surface of the fourth gate oxide layer in the fourth device region is defined as a horizontal reference plane, and wherein both of the first top surface in the first device region and the second top surface in the second device region of the first trench isolation structure are above the horizontal reference plane.

2. The semiconductor structure according to claim 1, wherein the second device region is an input/output (I/O) device region.

3. The semiconductor structure according to claim 1, wherein a top surface of the substrate within the first device region is lower than a top surface of the substrate within the second device region.

4. The semiconductor structure according to claim 1, wherein the first gate oxide layer has a thickness of about 200-220 angstroms and the second gate oxide layer has a thickness of about 30-60 angstroms.

5. The semiconductor structure according to claim 1, wherein a top surface of the second gate oxide layer is coplanar with the second top surface of the first trench isolation structure within the second device region.

6. The semiconductor structure according to claim 3, wherein the second trench isolation structure comprises a third bottom surface within the second device region and a fourth bottom surface within the third device region, wherein the third bottom surface is coplanar with the fourth bottom surface.

7. The semiconductor structure according to claim 6, wherein the third device region is a 1.2V device region.

8. The semiconductor structure according to claim 6, wherein the third trench isolation structure comprises a fifth bottom surface within the third device region and a sixth bottom surface within the fourth device region, wherein the fifth bottom surface is coplanar with the sixth bottom surface.

9. The semiconductor structure according to claim 8, wherein the fourth device region is a SRAM device region.

* * * * *